(12) United States Patent
Zeller

(10) Patent No.: US 7,911,276 B1
(45) Date of Patent: Mar. 22, 2011

(54) TRANSCONDUCTOR CIRCUIT

(75) Inventor: Sebastian Zeller, Grassbrunn (DE)

(73) Assignee: STMicroelectronics Design and Application GmbH, Grassbrunn (DE)

( * ) Notice: Subject to any disclaimer, the term of this patent is extended or adjusted under 35 U.S.C. 154(b) by 0 days.

(21) Appl. No.: 12/608,508

(22) Filed: Oct. 29, 2009

(51) Int. Cl.
*H03F 3/16* (2006.01)

(52) U.S. Cl. ........................................ 330/300; 330/253

(58) Field of Classification Search .................. 330/261, 330/153, 300
See application file for complete search history.

(56) References Cited

U.S. PATENT DOCUMENTS

| | | | | |
|---|---|---|---|---|
| 4,418,321 A | * | 11/1983 | Bohme | 330/252 |
| 5,489,876 A | * | 2/1996 | Pernici | 330/300 |
| 5,847,607 A | * | 12/1998 | Lewicki et al. | 330/300 |
| 7,408,409 B2 | * | 8/2008 | Kern | 330/253 |

* cited by examiner

Primary Examiner — Khanh V Nguyen
(74) Attorney, Agent, or Firm — Lisa K. Jorgenson; E. Russell Tarleton; Seed IP Law Group PLLC

(57) ABSTRACT

A low noise, highly linear transconductor circuit, which may be applied, e.g., in communication systems, includes a first input node for receiving a first input signal of the transconductor circuit and a second input node for receiving a second input signal of the transconductor circuit, and at least a first amplifier, a second amplifier, and a first, second and third resistor. Each of the first and second amplifiers includes an input stage with a combination of at least a transistor of the MOS type and a transistor of the bipolar type, and an output stage for providing a respective output signal of the transconductor circuit and having at least a transistor of the bipolar type. The circuit achieves reduced noise due to output current reuse in the input stage of the amplifiers and cross coupling of bias resistors to result in a highly linear transconductor circuit having very low noise.

15 Claims, 2 Drawing Sheets

TRANSCONDUCTOR CIRCUIT

BACKGROUND

1. Technical Field

The present disclosure pertains to a transconductor circuit having increased linearity and reduced noise.

2. Description of the Related Art

One approach that has been used for providing a transconductor circuit, applied for example in a communication system, such as in highly integrated tuners for radio frequency reception, is shown in the circuit diagram of FIG. 1. The transconductor circuit as shown in FIG. 1 may be used as a broadband low noise transconductor suitable for high source impedance (e.g., a tuned high-Q RF filter) and typically includes a MOS transistor differential pair. Particularly, the circuit according to FIG. 1 includes a first transistor T1 and second transistor T2 each of the MOS type that are coupled to form a differential pair or differential amplifier. The transistor T1 includes a control node at its gate that is coupled to a first input node INp, and the transistor T2 includes a control node at its gate which is coupled to a second input node INn. The controlled paths of the transistors T1 and T2 are coupled with each other at the source nodes of the transistors which are both coupled to a current source S. At the drain nodes of the transistors T1 and T2 respective output signals may be provided, for example supplied to a mixer circuit.

With the circuit of FIG. 1, input voltage signals at the input nodes INp and INn may be transferred in current output signals provided at the controlled paths of the transistors T1 and T2. However, there are often needs for providing a steep input characteristic of the transconductor circuit while providing at the same time low output current noise. Moreover, the characteristic should be mostly linear that is, however, in contrast to providing low output current noise. A differential pair consisting of transistors of the bipolar type is not preferred due to its base current noise.

Another approach that has been used for providing a transconductor circuit is shown in FIG. 2. According to the transconductor circuit of FIG. 2, the circuit includes a transistor T1a having a control node that is coupled to an input node INp for receiving a first input signal. The second transistor T1b has a control node that is coupled to the second input node INn for receiving a second input signal of the transconductor circuit. Both transistors T1a and T1b are of the MOS type. The controlled paths of the transistors T1a and T1b are coupled to a respective current source S1 and S3. A second pair of transistors T2a and T2b are of the bipolar type and have respective control nodes which are coupled to the controlled path of transistor T1a and the controlled path of the transistor T1b, respectively. The controlled paths of the transistors T2a and T2b are each coupled to a respective resistor R and are coupled with each other through the resistors R to form a differential amplifier or differential pair. The controlled paths of both transistors T2a and T2b are connected to a current source S2. At the collector nodes of each transistor T2a and T2b a respective output current is provided, which may be supplied to a mixer of a tuning circuit. In such application, an antenna voltage signal may be provided at one of the input nodes INp and INn.

If a transconductor circuit is used to drive a so-called switching quartet of a Gilbert mixer, the circuit scheme of FIG. 2 is typically preferred in BiCMOS processes, because the lower capacitances at the collector of the NPN transistor used for transistors T2a and T2b compared to the drain capacitances of the NMOS transistor used for transistors T1 and T2 (FIG. 1) leads to lower radiation of the local oscillator clock via the input nodes and faster switching of a subsequent mixing quartet

BRIEF SUMMARY

According to one aspect, a transconductor circuit is provided that includes a first input node that receives a first input signal of the transconductor circuit and a second input node for receiving a second input signal of the transconductor circuit, and further comprising at least a first amplifier, a second amplifier, and first, second and third resistors. Each of the first and second amplifiers includes an input stage with the combination of at least a transistor of the MOS type and a transistor of the bipolar type, and an output stage for providing a respective output signal of the transconductor circuit and having at least a transistor of the bipolar type. The input stage of the first amplifier is coupled to the first input node and to the output stage of the first amplifier, and the input stage of the second amplifier is coupled to the second input node of the transconductor circuit and to the output stage of the second amplifier. The output stages of the first and second amplifiers are coupled with each other through at least the first resistor to form a differential amplifier or differential pair. The differential amplifier is biased by the second and third resistors, with one of the second and third resistors coupled to one end of the first resistor and the other of the second and third resistors coupled to the other end of the first resistor.

In a further aspect, the second resistor may be coupled between the output stage of the second amplifier and the input stage of the first amplifier, and the third resistor may be coupled between the output stage of the first amplifier and the input stage of the second amplifier.

In accordance with another aspect of the present disclosure, a circuit is provided that includes a differential amplifier having first and second amplifier circuits, each of the first and second amplifier circuits having an input stage and an output stage, each of the output stages having a controlled path; a first resistor coupling the controlled path of the output stage of the first amplifier circuit to the controlled path of the output stage of the second amplifier circuit; and first and second biasing resistors, the first biasing resistor coupling the output stage of the first amplifier circuit with the input stage of the second amplifier circuit and the second biasing resistor coupling the input stage of the second amplifier circuit with the output stage of the first amplifier circuit.

In accordance with another aspect of the foregoing circuit, the circuit includes an input stage having a combination of at least a transistor of the MOS type and a transistor of the bipolar type, and an output stage for providing a respective output signal of the transconductor circuit and having at least a transistor of the bipolar type, wherein the input stage of the first amplifier circuit is coupled to the first input node and the input stage of the second amplifier circuit is coupled to the second input node, the output stages of the first and second amplifier circuits are coupled with each other through at least the first resistor to form a differential amplifier.

In accordance with yet a further aspect of the foregoing circuit, the second resistor is coupled between the output stage of the second amplifier circuit and the input stage of the first amplifier circuit; and the third resistor is coupled between the output stage of the first amplifier circuit and the input stage of the second amplifier circuit.

In accordance with yet a further aspect of the foregoing circuit, the input stage of each of the first and second amplifier circuits has a first input, a second input and an output; the output stage of each of the first and second amplifier circuits has a control node and an output node; and wherein the first input of the input stage is coupled to the first or second input node, the second input of the input stage is coupled to the output node of the output stage, and the output of the input stage is coupled to the control node of the output stage.

Accordingly, a transconductor circuit is provided with increased linearity due to a fast control loop. Further, it achieves reduced noise due to output current reuse in the input stage of the amplifiers and cross coupling of bias resistors to result in a highly linear transconductor circuit having very low noise.

BRIEF DESCRIPTION OF THE SEVERAL VIEWS OF THE DRAWINGS

The foregoing aspects and other features and advantages of a transconductor circuit in accordance with the present disclosure will now be described with reference to the drawings, in which.

DETAILED DESCRIPTION

Figure 3:
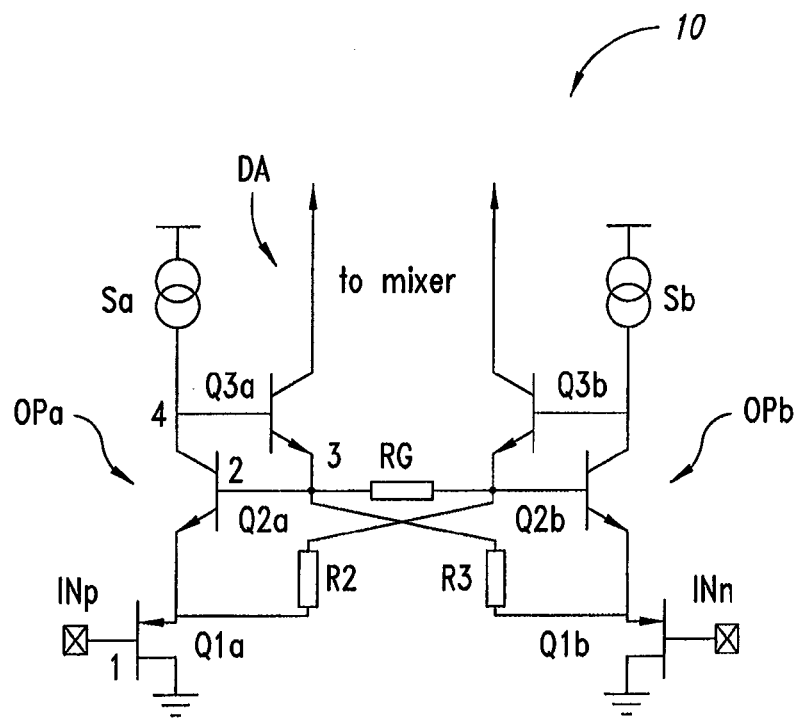
FIG. 3 shows a transconductor circuit according to the disclosure.

FIG. 3 shows a transconductor circuit according to the present disclosure that includes a first input node INp for receiving a first input signal of the transconductor circuit and a second input node INn for receiving a second input signal of the transconductor circuit. For example, at one of the first and second input nodes INp, INn a voltage input signal of an antenna may be provided, and an output current signal is generated therefrom, which may be provided to a mixer circuit of a tuning circuit. The transconductor circuit 10 of FIG. 3 further includes a first amplifier OPa and a second amplifier OPb, which both, in the present embodiment, function as operational amplifiers.

In the following description, the base and gate nodes of bipolar or MOS transistors, respectively, are generally referred to as control nodes, whereas the emitter-collector paths and drain-source paths are generally referred to as controlled paths of the respective transistor. The respective conductive types of MOS or bipolar transistors (particularly NMOS, PMOS, NPN, PNP conductive type) used herein are evident from the commonly known symbols used in the Figures. For example, transistors Q1 are of the PMOS type and transistors Q2 are of the NPN type.

The first amplifier OPa includes a first input stage and a first output stage. The first input stage includes a first transistor Q1$a$ of the MOS-type having a control node coupled to the first input node INp and having a controlled path which is, in the present embodiment, coupled at one end to ground at the drain node. The input stage further includes a second transistor Q2$a$ of the bipolar type having a controlled path coupled to the controlled path of the first transistor Q1$a$ and having a control node which is coupled to a controlled path of a third transistor Q3$a$ which forms at least part of the first output stage of the first amplifier OPa. A control node of the third transistor Q3$a$ is coupled to the controlled path of the second transistor Q2$a$. A first output signal, particularly an output current signal of the transconductor circuit, is provided at the controlled path of the third transistor Q3$a$.

Figure 4:
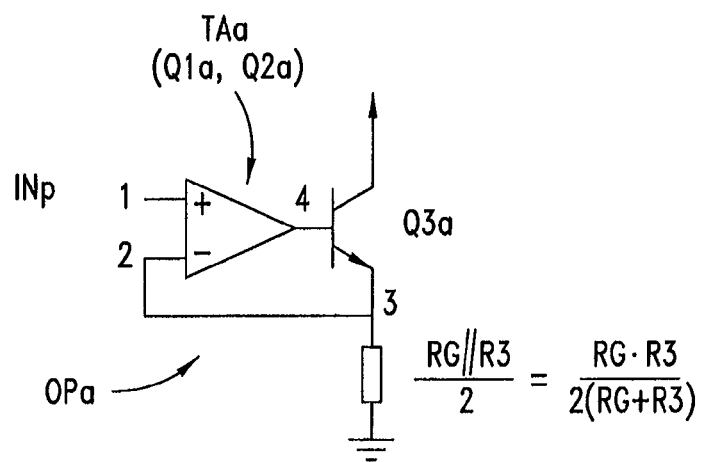
FIG. 4 shows an equivalent circuit diagram of a portion of the transconductor circuit of FIG. 3.

In FIG. 4, an equivalent circuit diagram of the first amplifier OPa for small signal domain is shown. With respect to FIG. 3, corresponding nodes of the circuits are designated with reference numerals 1, 2, 3, and 4. The transistors Q1$a$ and Q2$a$ together form a transconductor amplifier TAa forming the input stage of the first amplifier OPa, with the input node INp of the transconductor circuit coupled to node 1. In this way, the input stage of the amplifier OPa includes a combination of at least a transistor Q1$a$ of the MOS type and a transistor Q2$a$ of the bipolar type. The output stage of the first amplifier OPa is formed by transistor Q3$a$ which is of the bipolar type having its control node coupled to the output node 4 of the input stage, which is in the present embodiment the controlled path of transistor Q2$a$. An output node 3 of the output stage is provided at the controlled path of transistor Q3$a$. Accordingly, the first input 1 of the input stage formed by transistors Q1$a$, Q2$a$ is coupled to the first input node INp, a second input 2 of the input stage is coupled to the output node 3 of the output stage formed by transistor Q3$a$ and the output 4 of the input stage is coupled to the control node of the output stage formed by transistor Q3$a$.

The transconductor circuit 10 according to FIG. 3 further includes a second input stage and a second output stage of second amplifier OPb. Particularly, the second input stage includes a fourth transistor Q1$b$ of the MOS type having a control node coupled to the second input node INn of the transconductor circuit. The second input stage further includes a fifth transistor Q2$b$ of the bipolar type having a controlled path coupled to the controlled path of the fourth transistor Q1$b$. At the other end the controlled path of the fourth transistor Q1$b$ is coupled to ground at the drain node, as shown. The control node of the fifth transistor Q2$b$ is coupled to a controlled path of a sixth transistor Q3$b$ which forms at least part of the second output stage of the second amplifier OPb. A control node of the sixth transistor Q3$b$ is coupled to the controlled path of the fifth transistor Q2$b$. A second output signal of the transconductor circuit 10 is provided at the controlled path of the sixth transistor Q3$b$. The controlled paths of the transistors Q2$a$ and Q2$b$ are both coupled to a respective current source Sa and Sb at the respective collector nodes of transistors Q2$a$, Q2$b$.

The equivalent circuit diagram according to FIG. 4 may be applied analogously also for the second amplifier OPb, which is, however, not shown for reasons of brevity. Accordingly, an input stage of the second amplifier OPb includes the fourth transistor Q1$b$ and the fifth transistor Q2$b$, whereas transistor Q3$b$ forms at least part of the output stage of the second amplifier OPb.

The controlled paths of the third and sixth transistors Q3$a$, Q3$b$ are coupled with each other through at least a first resistor $R_G$ to form a differential amplifier DA. The differential amplifier DA is biased by second and third resistors R2 and R3 with one of the second and third resistors R2, R3 coupled to one end of the first resistor $R_G$ and the other of the second and third resistors R2, R3 coupled to the other end of the first resistor $R_G$.

In the embodiment shown in FIG. 3 the resistor R2 is cross coupled between the controlled path of the transistor Q3$b$ and the controlled path of the transistor Q1$a$. The resistor R3 is cross coupled between the controlled path of the transistor Q3$a$ and the controlled path of the transistor Q1$b$. According to this cross coupling of the bias resistors R2 and R3, the noise of the transconductor circuit 10 may be reduced due to reuse of the relatively high output currents of the transconductor in the input transistors Q1$a$, Q1$b$ and due to the contribution of R2 and R3 to the gain of the transconductor.

In applications, however, in which a reduced noise is not so important the bias resistors R2 and R3 may be coupled to the differential amplifier DA in that the resistor R2 is coupled between the controlled path of the transistor Q3a and the controlled path of the transistor Q1a, whereas resistor R3 is coupled between the controlled path of the transistor Q3b and the controlled path of the transistor Q1b.

According to the transconductor circuit as described above and as shown in FIG. 3, a new broadband low noise transconductor circuit is provided that is suitable for high source impedance and includes a respective fast single gain stage operational amplifier at each input node INp, INn. The respective operational amplifier includes a MOS-bipolar input stage (transistors Q1, Q2) and a bipolar output stage (transistors Q3). The output stages of both operational amplifiers OPa, OPb together with resistor $R_G$ form a differential amplifier or pair DA that is biased by the resistors R2 and R3 that are, for example, equal in magnitude. The bias current of the differential pair is defined by $V_{BE}(Q2)/R$ with $V_{BE}$ being the voltage between base and emitter of transistor Q2. With the circuit according to FIG. 3 the difference between the voltage at node 3 and the voltage at the input node INp is constant independently from the input voltage at input node INp:

$$V_3 - V_{INp} = \text{const.}$$

with $V_3$ being the voltage at node 3 and $V_{INp}$ being the voltage at node INp.

Further, the following equation may be formed:

$$IR_G = V_{INp} - V_{INn}$$

with I being the current flowing through resistor $R_G$ and $V_{INp}$ being the voltage at node INp and $V_{INn}$ being the voltage at node INn.

Neglecting base currents and drain current modulation of transistors Q1, the differential input voltage is transferred to a voltage drop across resistor $R_G$. Hence, the differential collector current of transistor Q3 is dependent only on the differential input voltage and on the parallel circuit of $R_G$ and R2, R3. For this reason with sufficiently fast transistors and linear resistors, excellent linearity of the transconductor circuit can be obtained.

Figure 1:
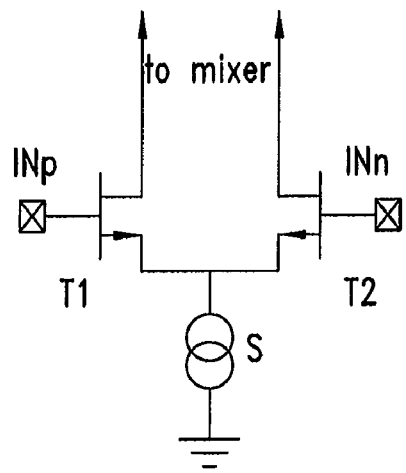
FIG. 1 shows a transconductor circuit according to one approach that has been used.
Figure 2:
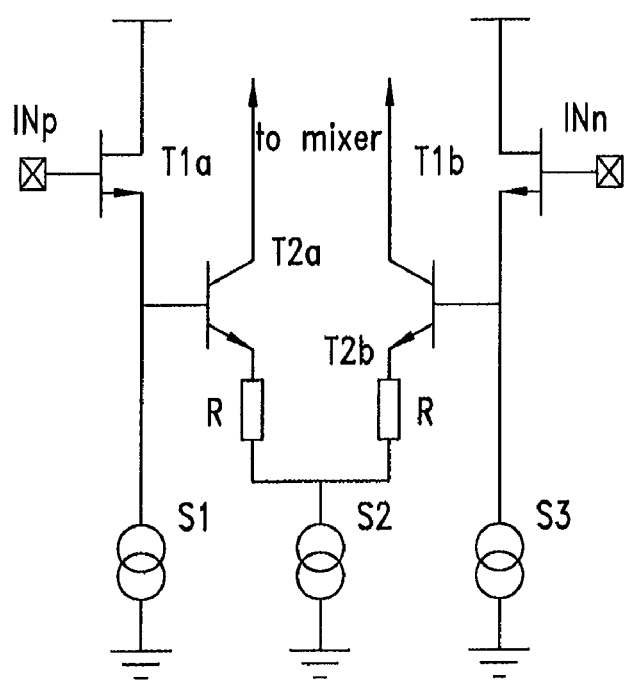
FIG. 2 shows a transconductor circuit according to another approach that has been used.

The input referred noise of the transconductor circuit is dominated by the input referred noise of the operational amplifiers OPa, OPb and the thermal noise of the resistors $R_G$, R2, R3. The differential pair bias currents are reused via the resistors R2, R3 in order to significantly reduce the input referred noise of the operational amplifiers, which is typically dominated by the noise of the MOS transistors. The current in controlled paths of the output transistors Q3 is reused in the controlled paths of the input transistors Q1 in order to achieve noise reduction. The cross coupling of the bias resistors R2, R3 helps to improve the gain of the transconductor. In this way the resistance $R_G$ can be increased, which reduces its thermal noise contribution. With these measures a very low input referred noise of the transconductor circuit can be obtained, typically several dB below prior approach solutions (as depicted, for example, in FIG. 2) at the same transconductance and power dissipation.

Since the base resistance noise of transistors Q3 is suppressed by the loop gains of the operational amplifiers OPa, OPb, their emitter area can be reduced significantly compared to prior approach solutions (as depicted, for example, in FIG. 2) without degrading the noise performance of the transconductor. In case of a subsequent mixing stage, this helps to reduce LO (local oscillator) radiation via the input nodes and improves the switching speed of the mixing quartet (when a Gilbert mixer is used in the subsequent mixing stage). The latter reduces the cyclostationary noise and improves the linearity of the mixing quartet.

Since the inputs of the transconductor are ground-compatible, no AC-coupling capacitors are needed.

While this detailed description has set forth some embodiments of the present disclosure, the appended claims cover also other embodiments of the present disclosure which may differ from the described embodiments according to various modifications and some aspects. For example, the conductive type of MOS or bipolar transistors (for example, NMOS, PMOS, NPN, PNP type transistors) may be used as shown or exchanged by the skilled person in another particular transconductor circuit as far as needed and applicable. Further, it is to be understood that the above description is intended to be illustrative and not restrictive. Moreover, in this disclosure the terms "first", "second", and "third", etc., are used merely as labels, and are not intended to impose numerical requirements on their objects. Other embodiments and modifications within the scope of the claims will be apparent to those of skill in the art upon studying the above description in connection with the drawings. The scope of the disclosure should, therefore, be determined with reference to the appended claims.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transconductor circuit, comprising
a first input node for receiving a first input signal of the transconductor circuit and a second input node for receiving a second input signal of the transconductor circuit;
at least a first amplifier, a second amplifier, and a first, second, and third resistor, each of the first and second amplifiers comprises an input stage having a combination of at least a transistor of the MOS type and a transistor of the bipolar type, and an output stage for providing a respective output signal of the transconductor circuit and having at least a transistor of the bipolar type, wherein the input stage of the first amplifier is coupled to the first input node and the input stage of the second amplifier is coupled to the second input node, the output stages of the first and second amplifiers are coupled with each other through at least the first resistor to form a differential amplifier; and
wherein the differential amplifier is biased by the second and third resistors, with one of the second and third resistors coupled to one end of the first resistor and the other of the second and third resistors coupled to the other end of the first resistor.

2. The transconductor circuit of claim 1, wherein
the second resistor is coupled between the output stage of the second amplifier and the input stage of the first amplifier; and
the third resistor is coupled between the output stage of the first amplifier and the input stage of the second amplifier.

3. The transconductor circuit of claim 1, wherein
the input stage of each of the first and second amplifiers has a first input, a second input and an output;
the output stage of each of the first and second amplifiers has a control node and an output node; and
wherein the first input of the input stage is coupled to the first or second input node, the second input of the input stage is coupled to the output node of the output stage, and the output of the input stage is coupled to the control node of the output stage.

4. The transconductor circuit of claim 1, wherein
the input stage of the first amplifier comprises a first transistor of the MOS-type having a control node coupled to the first input node, and comprises a second transistor of the bipolar type having a controlled path coupled to a controlled path of the first transistor and having a control node coupled to the output stage of the first amplifier.

5. The transconductor circuit of claim 1, wherein
the input stage of the second amplifier comprises a fourth transistor of the MOS-type having a control node coupled to the second input node, and comprises a fifth transistor of the bipolar type having a controlled path coupled to a controlled path of the fourth transistor and having a control node coupled to the output stage of the second amplifier.

6. The transconductor circuit of claim 1, wherein
the first and second amplifiers are operational amplifiers.

7. The transconductor circuit of claim 1, wherein
the first and second amplifiers each have single gain.

8. A transconductor circuit, comprising
a first input node for receiving a first input signal of the transconductor circuit and a second input node for receiving a second input signal of the transconductor circuit;
a first input stage and a first output stage;
the first input stage comprising a first transistor of the MOS-type having a control node coupled to the first input node, and comprising a second transistor of the bipolar type having a controlled path coupled to a controlled path of the first transistor and having a control node coupled to a controlled path of a third transistor which forms at least part of the first output stage, with a control node of the third transistor coupled to the controlled path of the second transistor and with a first output signal of the transconductor circuit provided at the controlled path of the third transistor;
a second input stage and a second output stage;
the second input stage comprising a fourth transistor of the MOS-type having a control node coupled to the second input node, and comprising a fifth transistor of the bipolar type having a controlled path coupled to a controlled path of the fourth transistor and having a control node coupled to a controlled path of a sixth transistor which forms at least part of the second output stage, with a control node of the sixth transistor coupled to the controlled path of the fifth transistor and with a second output signal of the transconductor circuit provided at the controlled path of the sixth transistor;
at least one first, second and third resistor;
wherein the controlled paths of the third and sixth transistors are coupled with each other through at least the first resistor to form a differential amplifier; and
wherein the differential amplifier is biased by the second and third resistors with one of the second and third resistors coupled to one end of the first resistor and the other of the second and third resistors coupled to the other end of the first resistor.

9. The transconductor circuit of claim 8, wherein
the second resistor is coupled between the controlled path of the sixth transistor and the controlled path of the first transistor; and
the third resistor is coupled between the controlled path of the third transistor and the controlled path of the fourth transistor.

10. A circuit, comprising:
a differential amplifier comprising first and second amplifier circuits, each of the first and second amplifier circuits having an input stage and an output stage, each of the output stages having a controlled path;
a first resistor coupling the controlled path of the output stage of the first amplifier circuit to the controlled path of the output stage of the second amplifier circuit; and
first and second biasing resistors, the first biasing resistor coupling the output stage of the first amplifier circuit with the input stage of the second amplifier circuit and the second biasing resistor coupling the input stage of the second amplifier circuit with the output stage of the first amplifier circuit.

11. The circuit of claim 10, wherein each of the first and second amplifier circuits comprises an input stage having a combination of at least a transistor of the MOS type and a transistor of the bipolar type, and an output stage for providing a respective output signal of the transconductor circuit and having at least a transistor of the bipolar type, wherein the input stage of the first amplifier circuit is coupled to the first input node and the input stage of the second amplifier circuit is coupled to the second input node, the output stages of the first and second amplifier circuits are coupled with each other through at least the first resistor to form a differential amplifier.

12. The circuit of claim 11, wherein
the second resistor is coupled between the output stage of the second amplifier circuit and the input stage of the first amplifier circuit; and
the third resistor is coupled between the output stage of the first amplifier circuit and the input stage of the second amplifier circuit.

13. The circuit of claim 11, wherein
the input stage of each of the first and second amplifier circuits has a first input, a second input and an output;
the output stage of each of the first and second amplifier circuits has a control node and an output node; and
wherein the first input of the input stage is coupled to the first or second input node, the second input of the input stage is coupled to the output node of the output stage, and the output of the input stage is coupled to the control node of the output stage.

14. The circuit of claim 11, wherein
the input stage of the first amplifier circuit comprises a first transistor of the MOS-type having a control node coupled to the first input node, and comprises a second transistor of the bipolar type having a controlled path coupled to a controlled path of the first transistor and having a control node coupled to the output stage of the first amplifier circuit; and the input stage of the second amplifier circuit comprises a fourth transistor of the MOS-type having a control node coupled to the second input node, and comprises a fifth transistor of the bipolar type having a controlled path coupled to a controlled path of the fourth transistor and having a control node coupled to the output stage of the second amplifier circuit.

15. The circuit of claim 11, wherein the first and second amplifier circuits comprise operational amplifiers that each have a single gain.

* * * * *